United States Patent
Ranchy et al.

[11] Patent Number: 6,166,903
[45] Date of Patent: Dec. 26, 2000

[54] ELECTRONIC POWER MODULE, AND ELECTRONIC POWER SYSTEM COMPRISING A PLURALITY OF SAID MODULES

[75] Inventors: Eric Ranchy, Clamart; Alain Petitbon, St Arnoult en Yvelines; Nadia Broqua, Nozay; Stéphane Cazabat, Massy; Pascal Estop, Vitry sur Seine; Sophie Crouzy, Bures sur Yvette, all of France

[73] Assignee: Alcatel, Paris, France

[21] Appl. No.: 09/077,806

[22] PCT Filed: Oct. 16, 1997

[86] PCT No.: PCT/FR97/01854

§ 371 Date: Jun. 15, 1998

§ 102(e) Date: Jun. 15, 1998

[87] PCT Pub. No.: WO98/16952

PCT Pub. Date: Apr. 23, 1998

[30] Foreign Application Priority Data

Oct. 16, 1996 [FR] France .................................. 96 12613

[51] Int. Cl.[7] .................................................. H05K 7/20
[52] U.S. Cl. ........................ 361/690; 165/80.4; 361/699; 361/701
[58] Field of Search .................................. 174/16.3, 252; 165/80.2, 80.4, 104.33; 257/714; 361/689–690, 699–704, 707, 710, 715, 775

[56] References Cited

U.S. PATENT DOCUMENTS

| | | | |
|---|---|---|---|
| 5,111,280 | 5/1992 | Iversen | 361/699 |
| 5,203,399 | 4/1993 | Koizumi | 165/104.3 |
| 5,526,231 | 6/1996 | Arz et al. | 361/699 |

FOREIGN PATENT DOCUMENTS

| | | |
|---|---|---|
| 21 46 558 | 3/1973 | Germany . |
| 4338277A1 | 1/1995 | Germany . |

OTHER PUBLICATIONS

Patent Abstracts of Japan. vol. 017. No. 504 (E–1430) Sep. 10, 1993 corresponding to JP 05 192487 A (Osaka Denki Co LTD) May 25, 1993.

*Primary Examiner*—Gregory Thompson
*Attorney, Agent, or Firm*—Sughrue, Mion, Zinn, Macpeak & Seas, PLLC

[57] ABSTRACT

The invention relates to an electronic power module comprising electronic power components (1) each having at least one contact face (2), control connections (4) for connecting the components to a control module, power connections (5) for conveying power between the components and/or other modules, and at least one metal heat exchanger (6) for removing power dissipated by the Joule effect in the electronic power components (1). According to the invention the contact faces (2) of the electronic power components (1) are mounted directly on the metal heat exchanger (6), the metal heat exchanger (6) being at the same potential as the contact faces (2) of the electronic power components (1).

22 Claims, 5 Drawing Sheets

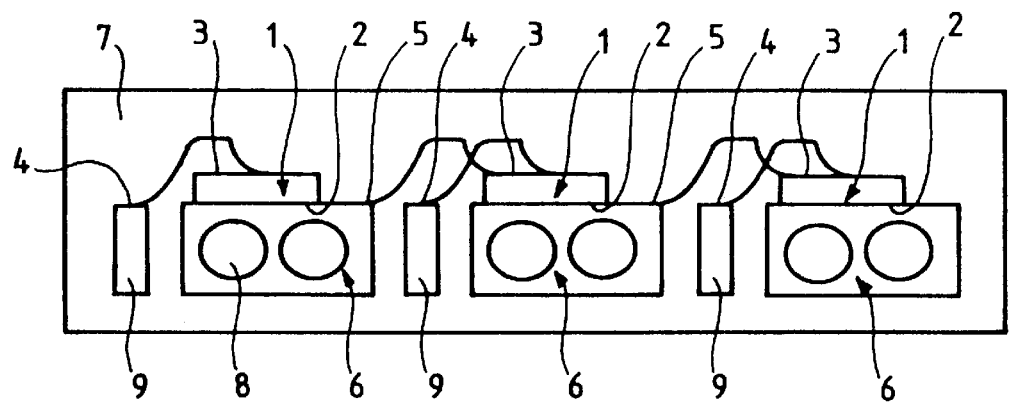
FIG_1
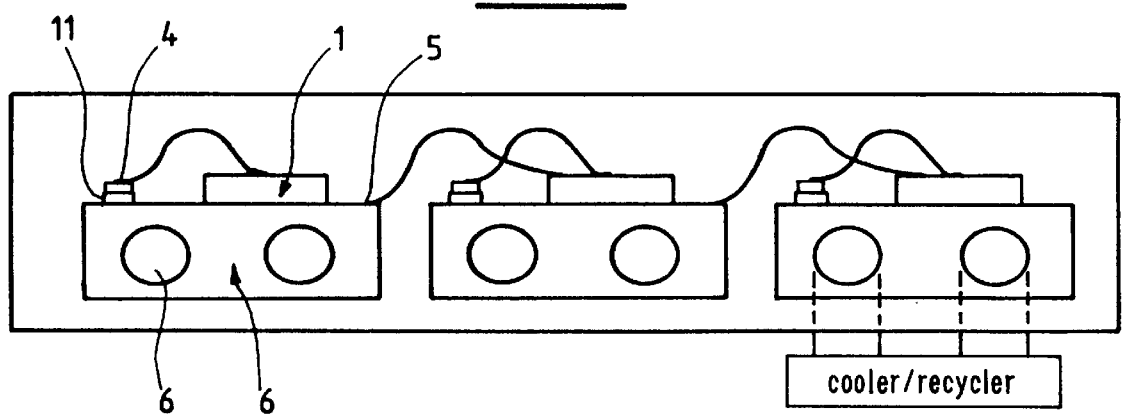
FIG_2
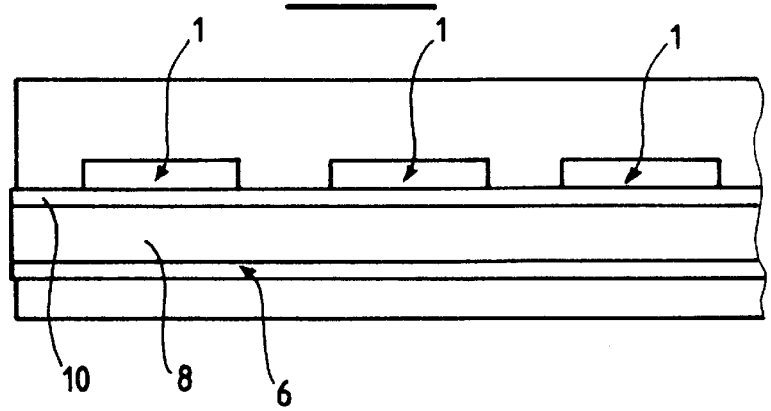
FIG_3

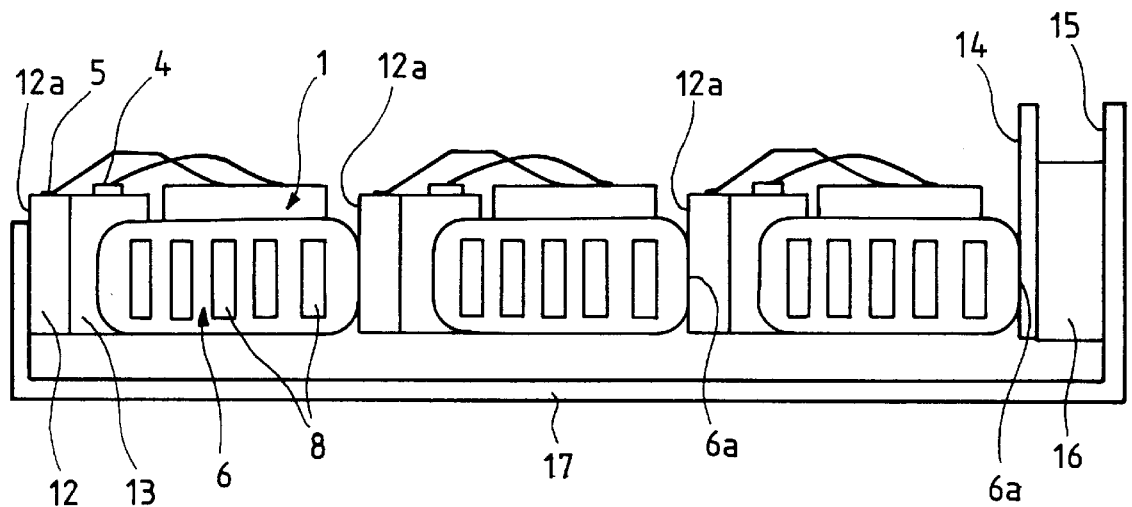
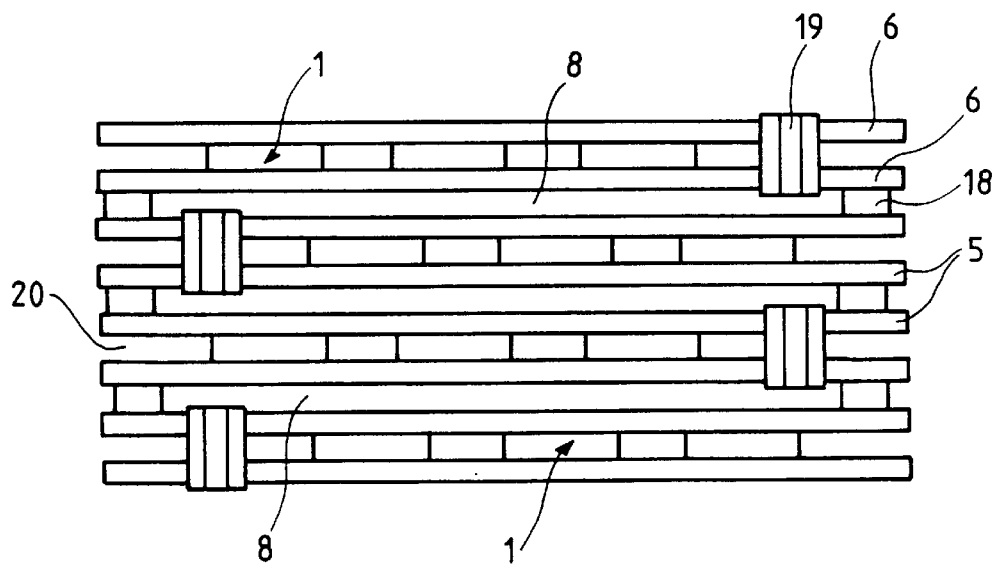

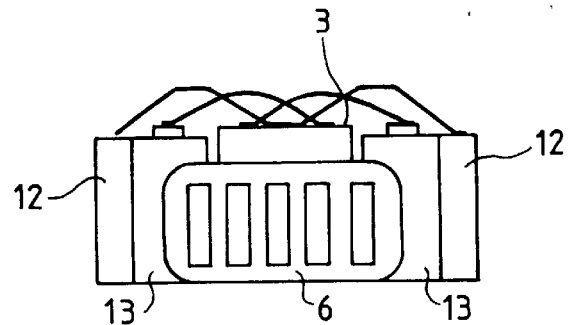
FIG_5
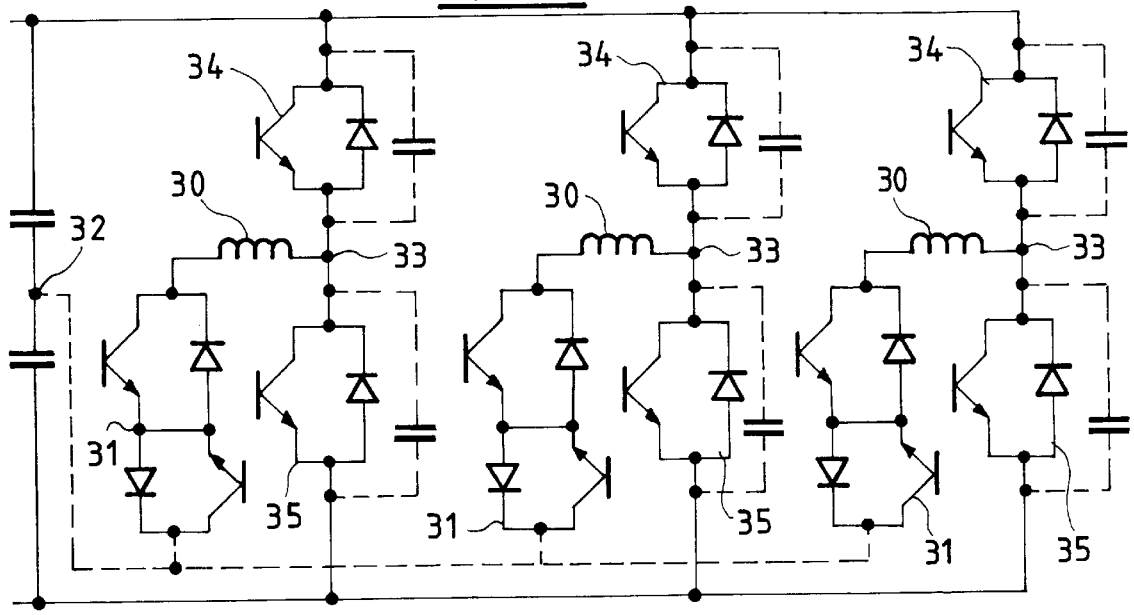
FIG_6
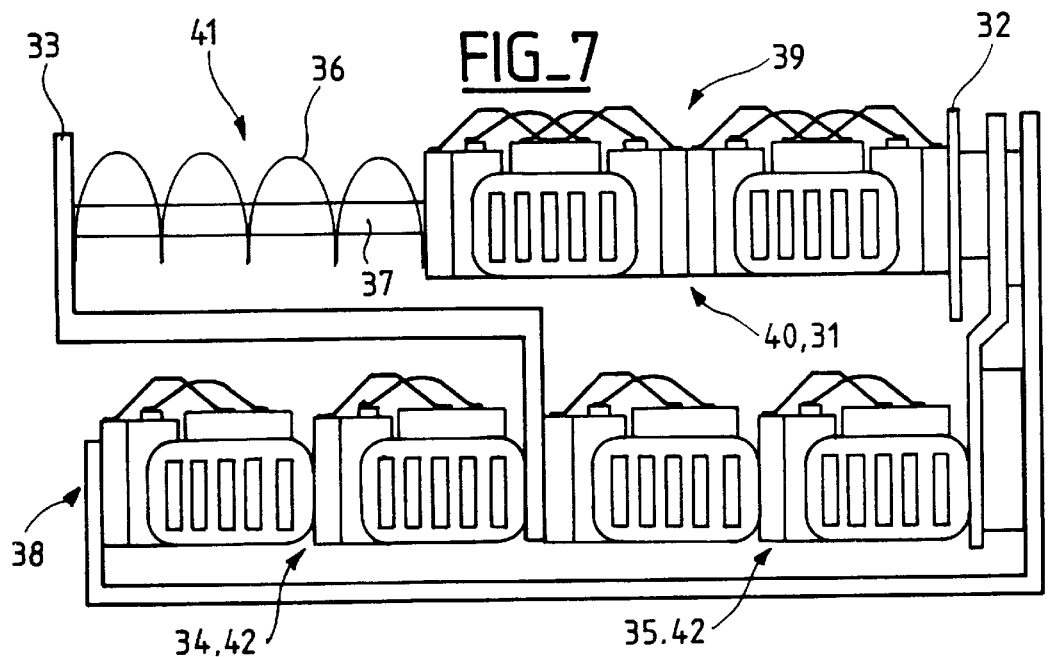
FIG_7

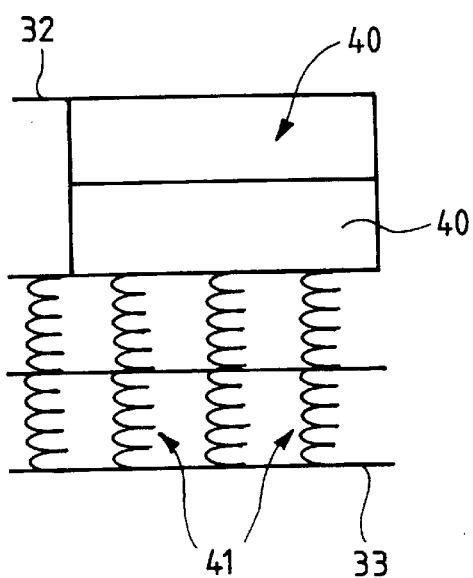
FIG_8
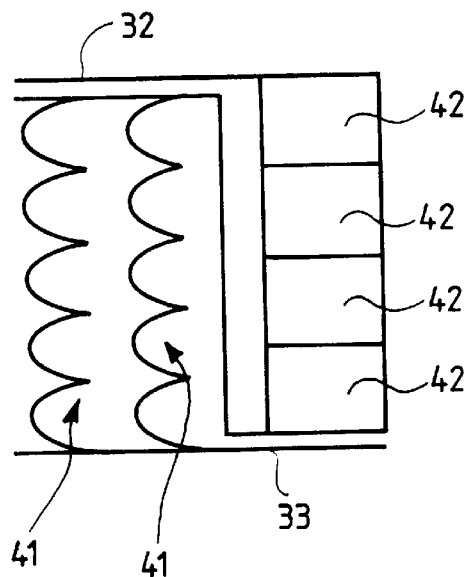
FIG_9
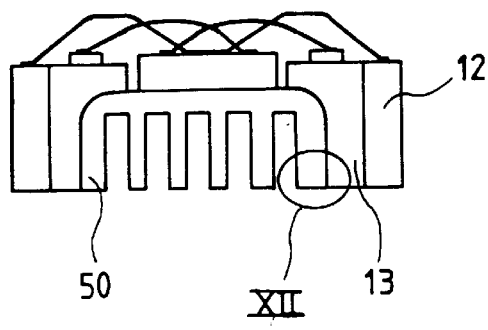
FIG_11
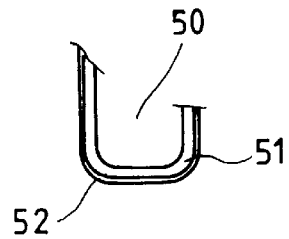
FIG_12

FIG_13
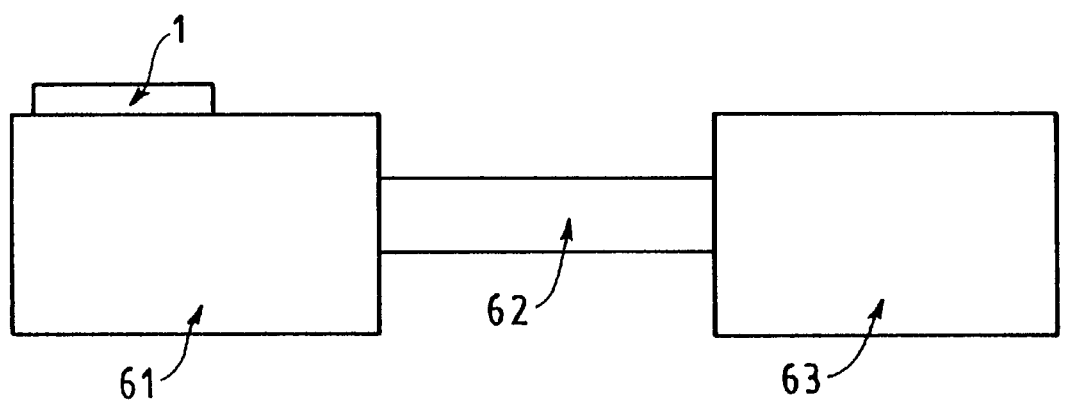

ELECTRONIC POWER MODULE, AND ELECTRONIC POWER SYSTEM COMPRISING A PLURALITY OF SAID MODULES

BACKGROUND OF THE INVENTION

In electronic power modules, it is necessary to cool electronic power components that are at high potentials.

The term "electronic power components" covers individual components, namely: semiconductor chips, e.g. silicon chips.

One conventional cooling means comprises soldering the component to a copper track, itself mounted on an electrically insulating ceramic of the AlN type or the equivalent, for the purpose of insulating the component and the copper track which are at high potential from the soleplate and the cooling device which are at ground potential.

That complex multilayer structure is well adapted to electrically insulating the power component, however the numerous solder, adhesive, and grease interfaces used for making the multilayer structure combine to constitute considerable total thermal resistance which reduces the ability of the structure suitably to remove the heat losses coming from the power components. In addition, the greater the potential, the thicker the dielectric ceramic layer needs to be, and unfortunately, it is known that ceramic dielectrics are not good conductors of heat.

It is also very difficult to find a material that is a good conductor of heat, a dielectric, and of low cost. For example, diamond satisfies the technical requirements, but its exorbitant purchase price disqualifies it for applications that require large areas and long production runs.

Another drawback of prior art power electronic modules is their poor ergonomy in a multi-module configuration. That is to say existing modules do not have simple means for making inter-module connections easily so as to build up multi-module electronic power systems.

SUMMARY OF THE INVENTION

An object of the present invention is to propose an electronic power module in which the dielectric materials used do not serve in any way as an interface for conveying heat and where the heat-conducting materials do not perform any electrical insulation function.

Another object of the present invention is to propose modules of improved ergonomy for making multi-module systems.

To this end, the invention provides an electronic power module comprising electronic power components each having at least one contact face, control connections for connecting the components to a control module, power connections for conveying power between the components and/or other modules, and at least one metal heat exchanger for removing heat power dissipated in the electronic power components. According to the invention, the contact faces of said electronic power components are directly mounted on and bonded to the metal heat exchanger, the metal heat exchanger being at the same potential as the contact faces of the electronic power components.

According to a dependent characteristic, the electronic power components and the metal heat exchanger are embedded in a dielectric material.

Advantageously, the metal heat exchanger includes passages through which a dielectric heat-conveying fluid flows, said passages being connected via dielectric pipes to a cooler/recycler at ground potential for the dielectric fluid.

In an embodiment, the control connections are independent and are electrically insulated from the metal heat exchanger.

Either the control connections are connected to a control busbar disposed parallel to the metal heat exchanger, or the control connections are mounted on the heat exchanger and are electrically insulated therefrom by a dielectric plate.

The power connections may be connected directly to the metal heat exchanger.

In another embodiment, the electronic power module comprises both a longitudinal power connection busbar independent from the metal heat exchanger and positioned to one side of the metal heat exchanger, and an electrically insulating element interposed between said power connection busbar and said metal heat exchanger.

Advantageously, the control connections are integrated on said interposed electrically insulating element.

In a third embodiment, the electronic power components are directly mounted between two plates of a metal heat exchanger, each plate being at the potential of the contact face, each plate constituting a wall of a heat exchanger.

The invention also provides a modular electronic power system comprising a plurality of electronic power modules as described above.

One of the main advantages of the present invention is to provide an electronic power module in which electrically insulating materials and heat-conducting materials are dissociated as much as possible, from one another to prevent the poor heat-conducting properties of electrically-insulating materials impeding the removal of heat, and to prevent the poor electrical insulation properties of heat-conducting materials from spoiling electrical insulation.

Another advantage of the present invention is to provide modules that can easily be associated with one another to build up electronic power systems such as modular converters.

BRIEF DESCRIPTION OF THE DRAWINGS

Other advantages and characteristics of the present invention appear from the following description given with reference to the accompanying drawings, in which:

FIG. 1 is a diagram of a modular electronic system constituting a first embodiment of the present invention.

FIG. 2 is a diagram of a variant of the first embodiment of the modular electronic system of the present invention.

FIG. 3 is a diagrammatic longitudinal section of a module as shown in FIG. 1 or 2.

FIG. 4 is a diagram of a modular electronic system constituting a second embodiment of the present invention.

FIG. 5 is a diagram of a "both-way switch" module of the present invention.

FIGS. 6 and 7 are respectively an electrical circuit diagram of soft switching apparatus and a diagrammatic view of a modular electronic system of the present invention implementing the FIG. 6 circuit.

FIGS. 8 and 9 show variants of the auxiliary circuit of FIG. 6.

FIG. 10 is a diagram of a modular electronic system constituting a third embodiment of the present invention.

FIG. 11 is a diagram of a module of the present invention provided with an air heat exchanger.

FIG. 12 is a diagram of a detail XII of FIG. 11.

FIG. 13 is an illustration of an alternative embodiment wherein the heat exchanger is a heatpipe.

DETAILED DESCRIPTION OF THE PREFERRED EMBODIMENTS

In the description below, the term "electronic power component" must be understood as a semiconductor chip, e.g. of the silicon type, or the equivalent.

An electronic power module of the invention comprises in conventional manner electronic power components 1 each having at least one contact face 2, control connections 4 for connecting the component 1 to a control module, power connections 5 for conveying power between components 1 and/or other modules, and at least one metal heat exchanger 6 for removing the power dissipated by the Joule effect in said electronic power components 1.

The material constituting the heat exchanger is metal. Nevertheless, it could be made of a material other than metal providing it has equivalent electrical and thermal conduction characteristics.

According to the invention, the contact faces 2 of the electronic power components are directly bonded to the metal heat exchanger 6, with the metal heat exchanger 6 being at the same potential as the contact faces 2 of the electronic power components 1.

As a result, any intermediate layer (in particular a ceramic dielectric) between the electronic power component and the heat exchanger is omitted, thereby reducing the thermal resistance between the component and the heat exchanger. The bond between the components and the heat exchanger can be of any known type, or it can be made by thermo-compressing the components on the metal heat exchanger 6.

The metal heat exchanger 6 may advantageously include passages 8 through which there flows a dielectric heat-conveying fluid. These passages 8 may constitute a closed circuit in which there is also provided a cooler/recycler for the dielectric fluid.

Water must be included as a possible heat-conveying fluid that is dielectric. Under such circumstances, apparatus should be provided to monitor the conductivity of the water and to maintain it at a desired value.

Insofar as it is preferable for the cooling/recycling portion to be at ground potential, dielectric pipes may be provided to connect the high voltage passages 8 to the grounded cooler/recycler.

The electronic power components 1 and the metal heat exchanger 6 are embedded in a dielectric material 7 serving to insulate the high voltage module electrically from the grounded case of the electrical machine in which it is located.

In the embodiment shown in FIGS. 1 to 3, the heat exchanger 6 comprises a metal busbar pierced by two longitudinal bores 8 for conveying the dielectric fluid. The electronic power components 1 are mounted directly on the bored metal busbar.

In the first embodiment shown in FIG. 1, the module also has a longitudinal metal busbar 9 for control purposes independent of the metal heat exchanger 6, on which the control connections 4 of the electronic power components 1 of the module are connected.

The module may be associated with one or more modules of the same type, placed in parallel with one another, each having its own independent control busbar 9, with the power connections 5 between the modules being connected directly to the heat exchangers 6.

Once the parts have been assembled and connected together, the entire assembly of modules is embedded in a dielectric material 7.

The dielectric material 7 may be a dielectric gel filling a dielectric housing containing the module(s).

As shown in FIG. 3, the control busbars 9 and the heat exchanger 6 have through electric connections 10 so that the encapsulated modules can be powered and controlled.

FIG. 2 shows a variant of the first embodiment in which the control connections 4 are mounted on the heat exchangers 6, and are insulated therefrom by respective dielectric plates 11. This solution is possible because the heat losses from the control connections are practically non-existent (low voltage).

In another embodiment of the module of the invention, as shown in FIG. 4, the module comprises a longitudinal power connection busbar 12 which is independent of the metal heat exchanger 6, which is positioned to one side of the metal heat exchanger 6, and which is electrically connected to the free face 3 of at least one of the electronic power components 1, the module also having an electrically insulating element 13 interposed between said power connection busbar 12 and the metal heat exchanger 6.

In a multi-module disposition (FIG. 4), the free side face 12a of the longitudinal power connection busbar 12 is in mechanical and electrical contact with the side wall 6a of the metal heat exchanger 6 of the preceding module, thereby transmitting power between modules. The multi-module system is powered via two parallel feeds 14 and 15 that are close to each other and separated by a dielectric spacer 16, one of the feeds 14 being placed in contact with the free side face 6a of the heat exchanger 6 of one of the two end modules, while the other feed 15 has a U-shaped extension 17 and is disposed in contact with the free side face 12a of the longitudinal power connection busbar 12 of the other end module. Advantageously, intermediate feeds may be provided located between pairs of consecutive modules of the multi-module system. Having the parallel feeds 14 and 15 close together considerably reduces parasitic inductance and Joule effect losses in the feeds.

Advantageously, the control connections 4 are integrated on the interposed electrically insulating element 13. As before, the multi-module can be embedded in a dielectric that serves to insulate it from parts of the machine that are at ground potential.

The invention also provides a "both-way switch" module as shown in FIG. 5. The module has two longitudinal power connection busbars 12 that are independent of the metal heat exchanger 6, and that are disposed on opposite sides of the metal heat exchanger 6, an electrically-insulating element 13 being interposed between each power connection busbar 12 and the metal heat exchanger 6.

The free faces 3 of the electronic power components 1 of the module are connected alternately to one and the other of the two longitudinal power connection busbars 12.

The modular concept is equally applicable to one or more "both-way switch" modules.

FIGS. 6 and 7 are respectively an electrical circuit diagram for "soft" type switching, and a diagram of its physical implementation based on modular circuits using modules of the invention.

A soft switching apparatus comprises firstly a main switch circuit whose connections are shown in continuous lines, and secondly an auxiliary circuit whose connections are shown in dashed lines in FIG. 6.

The auxiliary circuit has inductors 30 and switches 31. The auxiliary circuit is connected in parallel with the main switch circuit between a midpoint 32 and a live point 33, the live point being positioned between a pair of switches 34, 35 of the main circuit.

In addition to the modules described above, the circuit of FIG. 7 has inductor modules 41. Each of these inductor modules 41 comprises an inductor winding 36 on a ferrite core 37.

The circuit of FIG. 7 has a lower stage 38 for the main switches 34, 35 made of simple switch modules 42 of the invention, and an upper stage 39 for the auxiliary circuit comprising "both-way switch" modules 40 together with inductor modules 41. Each main switch 34, 35 is made up from two simple switch modules 42.

As shown in FIGS. 8 and 9, the auxiliary stage can be implemented in various ways.

FIG. 8 shows an embodiment with "both-way switch" modules 40.

FIG. 9 shows an embodiment with simple modules 42.

In another embodiment of a multi-module system of the invention, as shown in FIG. 10, the multi-module organization is based on the principle of a plate heat exchanger.

In this embodiment, the electronic power components 1 of each module are disposed between and in contact with two plates of the metal heat exchanger 6, 6'. The modules are disposed on one another and are insulated from one another by dielectric spacers 18, each metal plate 6, 6' of a module co-operating with the facing metal plate 6, 6' of the following or preceding module to leave a passage 8 for the flow of dielectric heat-conveying fluid. The dielectric spacers 18 seal the passages 8.

The passages 8 for the flow of heat-conveying fluid are interconnected by dielectric manifolds 19.

Advantageously, the heat-conveying fluid may be put under pressure so as to apply contact pressure against the metal plates 6, 6' so that they press against the contact faces 2 of the electronic power components 1.

Each plate 6, 6' projects beyond the dielectric spacers 18 so as to constitute power connections 5. The control connections are fed to the electronic power components 1 of a module via the inter-plate gap 20 of the module.

One of the main advantages of the present invention is to provide an electronic power module in which the materials providing electrical insulation and the materials providing heat conduction are dissociated from one another as much as possible so as to avoid the poor heat conduction properties of electrically-insulating materials having an affect on the removal of heat, and so as to avoid the poor electrical insulating properties of heat-conducting materials from affecting electrical insulation.

Another advantage of the present invention is to provide modules that can be easily be associated with one another to form electronic power systems, e.g. modular converters.

An advantage of these multi-module systems is to make it possible to calibrate the system both with respect to current as a function of the number of electronic power components fitted per elementary module, and with respect to voltage as a function of the number of elementary modules associated in the electronic power system.

Naturally, the invention is not limited to the implementations or embodiments described and shown, and numerous variants are possible and available to the person skilled in the art without going beyond the invention. For example other types of heat exchanger can be used.

The metal heat exchanger may be an air-cooled heat exchanger (see FIGS. 11 and 12). Under such circumstances, the heat exchanger has fins 50 on its face facing away from the face on which the electronic power components 1 are directly bonded. The flow of air passes between the fins 50. Heat transfer from the electronic power components 1 to the flow of air comprises transfer firstly by direct conduction from the face in contact with the electronic power components 1 to the equipotential heat exchanger, and then by convection from the fins 50 which define a large heat exchange area to the flow of air.

In order to improve electrical insulation, the fins 50 may be electrically insulated by depositing a dielectric coating 51 thereon. The electrically-insulating portion is located on a large heat exchange area and as a result it does not penalize heat exchange by conduction between the electronic power components 1 and the equipotential metal heat exchanger.

In order to avoid any charge accumulating on the coated heat-exchange area of the fins 50, a conductive layer 52 may advantageously be deposited on the dielectric coating 51, said conductive layer 52 being connected to a given potential. This conductive layer 52 is not subject to any mechanical stress, and since it conveys substantially no current, it can be very thin.

In another embodiment the heat exchanger may be constituted by a heatpipe, as illustrated in FIG. 13. The heatpipe has a hollow metal vaporization chamber 61 with the electronic power components 1 mounted directly on the outside surface thereof. The chamber is at the same potential as the contacting faces of the electronic power components 1. The heatpipe also has a condensation chamber.

The operation of a heatpipe is known per se and is not described herein.

In one embodiment, a hollow insulating intermediate portion of dielectric material 62 is interposed between the vaporization chamber 63 and the condensation chamber.

What is claimed is:

1. An electronic power module comprising electronic power components (1) each having at least one contact face (2), control connections (4) for connecting the components to a control module, power connections (5) for conveying power between the components and/or other modules, and at least one metal heat exchanger (6) for removing power dissipated by the Joule effect in said electronic power components (1), characterized in that the contact faces (2) of said electronic power components (1) are mounted directly on the metal heat exchanger (6), the metal heat exchanger (6) being at the same potential as the contact faces (2) of the electronic power components (1), where said same potential is a high voltage above a ground potential.

2. An electronic power module according to claim 1, characterized in that the electronic power components (1) and the metal heat exchanger (6) are embedded in a dielectric material (7).

3. An electronic power module according to claim 1 or 2, characterized in that the metal heat exchanger (6) includes passages (8) through which a dielectric heat-conveying fluid flows, said passages (8) being connected via dielectric pipes to a cooler/recycler at ground potential for the dielectric fluid.

4. An electronic power module according to claim 1 or 2, characterized in that the metal heat exchanger (6) is an air-cooled heat exchanger having fins (50) on a face opposite from its face on which the electronic power components (1) are directly bonded, the air flowing between the fins (50).

5. An electronic power module according to claim 4, characterized in that the fins (50) are electrically insulated by a dielectric coating (51) deposited thereon.

6. An electronic power module according to claim 5, characterized in that the coated fins (50) further have a conductive layer (52) deposited on the dielectric coating (51), said conductive layer (52) being put at a given potential.

7. An electronic power module according to claim 1, characterized in that the metal heat exchanger (6) is a heatpipe comprising a hollow metal vaporization chamber having the electronic power components (1) mounted directly on the outside surface thereof, said chamber being at the same potential as the contact faces of the electronic power components (1), and an insulating hollow intermediate portion of dielectric material connecting the hollow metal vaporization chamber to a condensation chamber.

8. An electronic power module according to claim 1, characterized in that the control connections (4) are independent and are electrically insulated from the metal heat exchanger (6).

9. An electronic power module according to claim 8, characterized in that the control connections (4) are connected to a control busbar (9) disposed parallel to the metal heat exchanger (6).

10. An electronic power module according to claim 1, characterized in that each control connection (4) is mounted on the heat exchanger (6) and is electrically insulated from the heat exchanger (6) by a dielectric plate (11).

11. An electronic power module according to claim 1, characterized in that the power connections (5) are connected directly to the metal heat exchanger (6).

12. An electronic power module according to claim 1, characterized in that it comprises both a longitudinal power connection busbar (12) independent from the metal heat exchanger (6) and positioned to one side of the metal heat exchanger (6), and an electrically insulating element (13) interposed between said power connection busbar (12) and said metal heat exchanger (6).

13. An electronic power module according to any one of claim 1, characterized in that it comprises two longitudinal power connection busbars (12) independent of the metal heat exchanger (6) and positioned on either side of the metal heat exchanger (6), an electrically insulating element (13) being interposed between each power connection busbar (12) and the metal heat exchanger (6), the free faces (3) of the electronic power components (1) of the module being connected in alternation to one and the other of the two longitudinal power connection busbars (12).

14. An electronic power module according to claim 12, characterized in that the control connections (14) are integrated on said interposed electrically insulating element (13).

15. An electronic power module according to claim 1, characterized in that the electronic power components are directly mounted between two plates (6, 6') of a metal heat exchanger, each plate (6, 6') being at the potential of the contact face (3), each plate (6, 6') constituting a wall of a heat exchanger.

16. A multi-module electronic power system, characterized in that it comprises a plurality of interconnected electronic power modules according to claim 1.

17. A multi-module electronic power system, characterized in that it comprises a plurality of interconnected electronic power modules according to claim 12, the free side face (12a) of the longitudinal power connection busbar (12) of one module being in mechanical and electrical contact with the side wall (6a) of the metal heat exchanger (6) or with the free side face (12a) of the longitudinal power connection busbar (12) of the preceding module, thereby ensuring that power is conveyed between modules.

18. A modular electronic power system according to claim 17, characterized in that it is fed by two parallel feeds (14, 15) close to each other and separated by a dielectric spacer (16), one of the feeds (14) being disposed in contact with the free side face (6a) of the heat exchanger (6) of one of the end modules, while the other feed (15) has a U-shaped extension (17) and is disposed in contact with the free side face (12a) of the longitudinal power connection busbar (12) of the other end module.

19. A modular electronic power system according to claim 17, characterized in that it further comprises inductor modules (41) each comprising an inductor winding (36) about a ferrite core (37).

20. A multi-module electronic power system, characterized in that it comprises a plurality of electronic power modules according to claim 15, the modules being disposed one on another, being insulated from one another by dielectric spacers (18), each metal plate (6, 6') of a module co-operating with the facing metal plate (6, 6') of the following or preceding module to form a passage (8) for flow of the dielectric heat-conveying fluid, the passage (8) for flow of the heat-conveying fluid being interconnected via dielectric manifolds (19).

21. A multi-module electronic power system according to claim 20, characterized in that each plate (6, 6') projects beyond the dielectric spacers (18) so as to constitute power connections (5).

22. A multi-module electronic power system according to claim 20, characterized in that the control connections (4) are brought to the electronic power components of a module via the inter-plate gap (20) between modules by means of an electrically insulated wire.

* * * * *